(12) United States Patent
Yu

(10) Patent No.: US 11,406,031 B2
(45) Date of Patent: Aug. 2, 2022

(54) SERVER EQUIPMENT AND ITS LATCH MECHANISM

(71) Applicant: CHENBRO MICOM CO., LTD., New Taipei (TW)

(72) Inventor: Cheng-Han Yu, New Taipei (TW)

(73) Assignee: CHENBRO MICOM CO., LTD., New Taipei (TW)

( * ) Notice: Subject to any disclaimer, the term of this patent is extended or adjusted under 35 U.S.C. 154(b) by 0 days.

(21) Appl. No.: 17/319,100

(22) Filed: May 13, 2021

(65) Prior Publication Data

US 2021/0360807 A1 Nov. 18, 2021

(30) Foreign Application Priority Data

May 14, 2020 (TW) .................................. 109116081

(51) Int. Cl.
*G06F 1/16* (2006.01)
*H05K 5/02* (2006.01)

(52) U.S. Cl.
CPC ......... *H05K 5/0221* (2013.01); *G06F 1/1679* (2013.01)

(58) Field of Classification Search
CPC .. H05K 5/0221; H05K 7/1489; G06F 1/1679; G06F 1/186
See application file for complete search history.

(56) References Cited

U.S. PATENT DOCUMENTS 9,207,724 B2 12/2015 Coster et al.
10,765,028 B1 * 9/2020 Beall .................... H05K 7/1489

FOREIGN PATENT DOCUMENTS

| CN | 103838319 A | 6/2014 |
| TW | M428711 U1 | 5/2012 |
| TW | I530774 B | 4/2016 |
| TW | I645810 B | 1/2019 |
| TW | M599072 U | 7/2020 |

* cited by examiner

*Primary Examiner* — James Wu
*Assistant Examiner* — Hung Q Dang
(74) *Attorney, Agent, or Firm* — CKC & Partners Co., LLC

(57) ABSTRACT

A latch mechanism includes a bracket, a sliding element slidably located on the bracket, a latch portion fixedly connected to the sliding element, an elastic element connected to the bracket and the sliding element, and a trigger element including an elongated frame, a through hole and a pressed portion. The elongated frame is slidably located on the bracket, the through hole is formed on one surface of the elongated frame, and the pressed portion is disposed on the one surface of the elongated frame, and directly pressed by the latch portion. When the trigger element is pushed until the through hole is moved to the latch portion, the first elastic element moves the latch portion to extend into the through hole.

10 Claims, 5 Drawing Sheets

SERVER EQUIPMENT AND ITS LATCH MECHANISM

RELATED APPLICATIONS

This application claims priority to Taiwan Application Serial Number 109116081, filed on May 14, 2020, which is herein incorporated by reference.

BACKGROUND

Field of Disclosure

The present disclosure relates to a latch mechanism. More particularly, the present disclosure relates to a server equipment having a latch mechanism.

Description of Related Art

In general, a conventional server unit is installed with a latch mechanism to position the server unit in a predetermined position within a rack of the server unit and to prevent the server unit from shaking unexpectedly in the rack, or even from derailing so as to cause safety concerns.

However, the latch mechanism of the conventional server unit is located within the rack of the server unit, which not only occupies the configuration space of the rack, but also increases the complexity of an installation process of the conventional server unit.

Therefore, how to develop a solution to improve the foregoing deficiencies and inconvenience is an important issue that relevant persons engaged in the industry are currently unable to delay.

SUMMARY

One aspect of the present disclosure is to provide a server equipment and its latch mechanism to solve the aforementioned problems of the prior art.

In one embodiment of the present disclosure, a latch mechanism is provided, and the latch mechanism includes a bracket, a sliding element, a latch portion, a first elastic element and a trigger element. The sliding element is slidably located on the bracket. The latch portion is fixedly connected to the sliding element. The first elastic element is connected to the bracket and the sliding element. The trigger element includes an elongated frame, a through hole and a pressed portion. The elongated frame is slidably located on the bracket, the through hole is formed on one surface of the elongated frame, and the pressed portion is disposed on the one surface of the elongated frame, and directly pressed by the latch portion. When the trigger element is pushed until the through hole is moved to the latch portion, the first elastic element moves the latch portion to extend into the through hole.

According to one or more embodiments of the present disclosure, in the latch mechanism, the bracket includes a front frame. The front frame is provided with a groove and a breach respectively at two opposite sides thereof, and the groove is in communication with the breach. The sliding element further includes a handle portion slidably disposed on one surface of the front frame opposite to the groove, and a sliding block extending into the groove through the breach and slidably received within the groove. The first elastic element is located within the groove to abut against an inner wall of the front frame and the sliding block.

According to one or more embodiments of the present disclosure, in the latch mechanism, the sliding element further includes a load pin. The load pin is disposed on the sliding block to go through the inner wall of the front frame and the first elastic element. Thus, when the latch portion is drawn back from the through hole, the first elastic element is compressed by the inner wall of the front frame and the sliding block.

According to one or more embodiments of the present disclosure, in the latch mechanism, the bracket further includes a side frame being adjacent to the front frame such that the elongated frame is slidably located on the side frame. A long axis direction of the front frame and a long axis direction of the side frame are orthogonal to each other.

According to one or more embodiments of the present disclosure, the latch mechanism further includes a second elastic element. The second elastic element is connected to the side frame and the elongated frame. Thus, when the latch portion is drawn back from the through hole, the second elastic element pushes the trigger element such that the latch portion is moved to the pressed portion from the through hole to directly press against the pressed portion.

In one embodiment of the present disclosure, a server equipment is provided, and the server equipment includes a chassis, at least one guide rail and a unit rack. The chassis is provided with a frame body, a stopping block and a fixing recess. The stopping block and the fixing recess are respectively disposed on the frame body. The guide rail is fixedly connected to an inner surface of the frame body. The unit rack includes a tray device and a latch mechanism. The tray device includes a case removably disposed within the frame body, and at least one sliding rail fixedly mounted on an outer side of the case and slidably located at the at least one guide rail. The latch mechanism includes a bracket disposed on the outer side of the case, a sliding element slidably located on the bracket, a latch portion fixedly connected to the sliding element, a first elastic element connected to the bracket and the sliding element, and a trigger element including an elongated frame, a through hole and a pressed portion. The elongated frame is slidably located on the bracket, the through hole is formed on one surface of the elongated frame, and the pressed portion is disposed on the one surface of the elongated frame, and directly pressed by the latch portion. When the case is slid along the guide rail until the stopping block pushes the trigger element such that the through hole is moved to the latch portion to align with the fixing recess, the first elastic element moves the latch portion to extend into the fixing recess through the through hole, thereby the tray device being fixedly held on the chassis.

According to one or more embodiments of the present disclosure, in the server equipment, the bracket includes a front frame. The front frame is provided with a groove and a breach respectively at two opposite sides thereof, and the groove is in communication with the breach. The sliding element further includes a handle portion slidably disposed on one surface of the front frame opposite to the groove, and a sliding block extending into the groove through the breach and slidably received within the groove. The first elastic element is located within the groove to abut against an inner wall of the front frame and the sliding block.

According to one or more embodiments of the present disclosure, in the server equipment, the sliding element further includes a load pin. The load pin is disposed on the sliding block to go through the inner wall of the front frame and the first elastic element. Thus, when the latch portion is drawn back from the through hole, the first elastic element is compressed by the inner wall of the front frame and the sliding block.

According to one or more embodiments of the present disclosure, in the server equipment, the bracket further includes a side frame being adjacent to the front frame and disposed below the sliding rail, such that the elongated frame is slidably located on the side frame. A long axis direction of the front frame and a long axis direction of the side frame are orthogonal to each other.

According to one or more embodiments of the present disclosure, the latch mechanism further includes a second elastic element. The second elastic element is connected to the side frame and the elongated frame. Thus, when the latch portion is drawn back from the through hole, the second elastic element pushes the trigger element such that the latch portion is moved to the pressed portion from the through hole to directly press against the pressed portion.

Thus, through the construction of the embodiments above, the present disclosure not only will prevent from occupying the configuration space of the unit rack, but also reducing the complexity of the installation process of the unit rack.

The above description is merely used for illustrating the problems to be resolved, the technical methods for resolving the problems and their efficacies, etc. The specific details of the present disclosure will be explained in the embodiments below and related drawings.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure.

DESCRIPTION OF THE EMBODIMENTS

Figure 1:
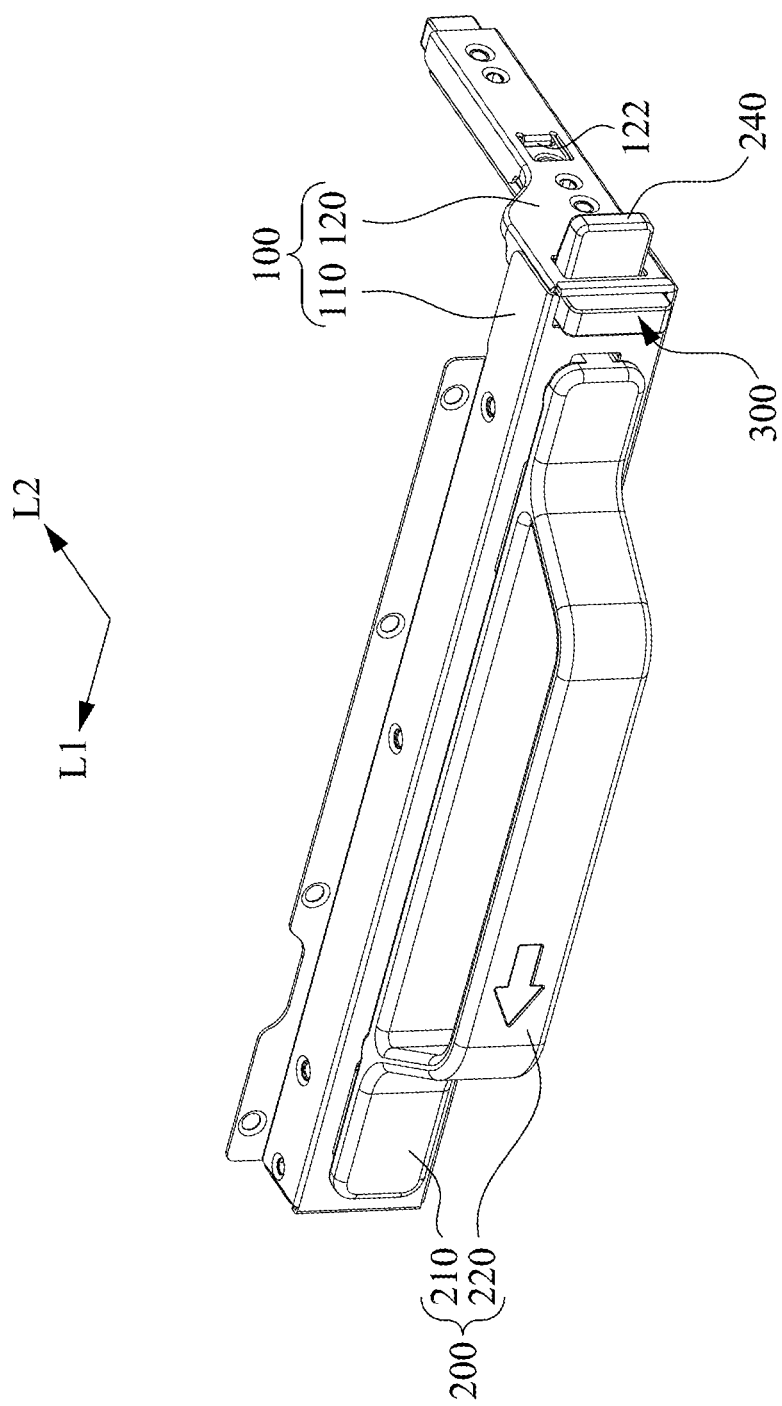
FIG. 1 is a perspective view of a latch mechanism according to one embodiment of the present disclosure.

Reference will now be made in detail to the present embodiments of the present disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the present disclosure without departing from the scope or spirit of the present disclosure.

Figure 2:
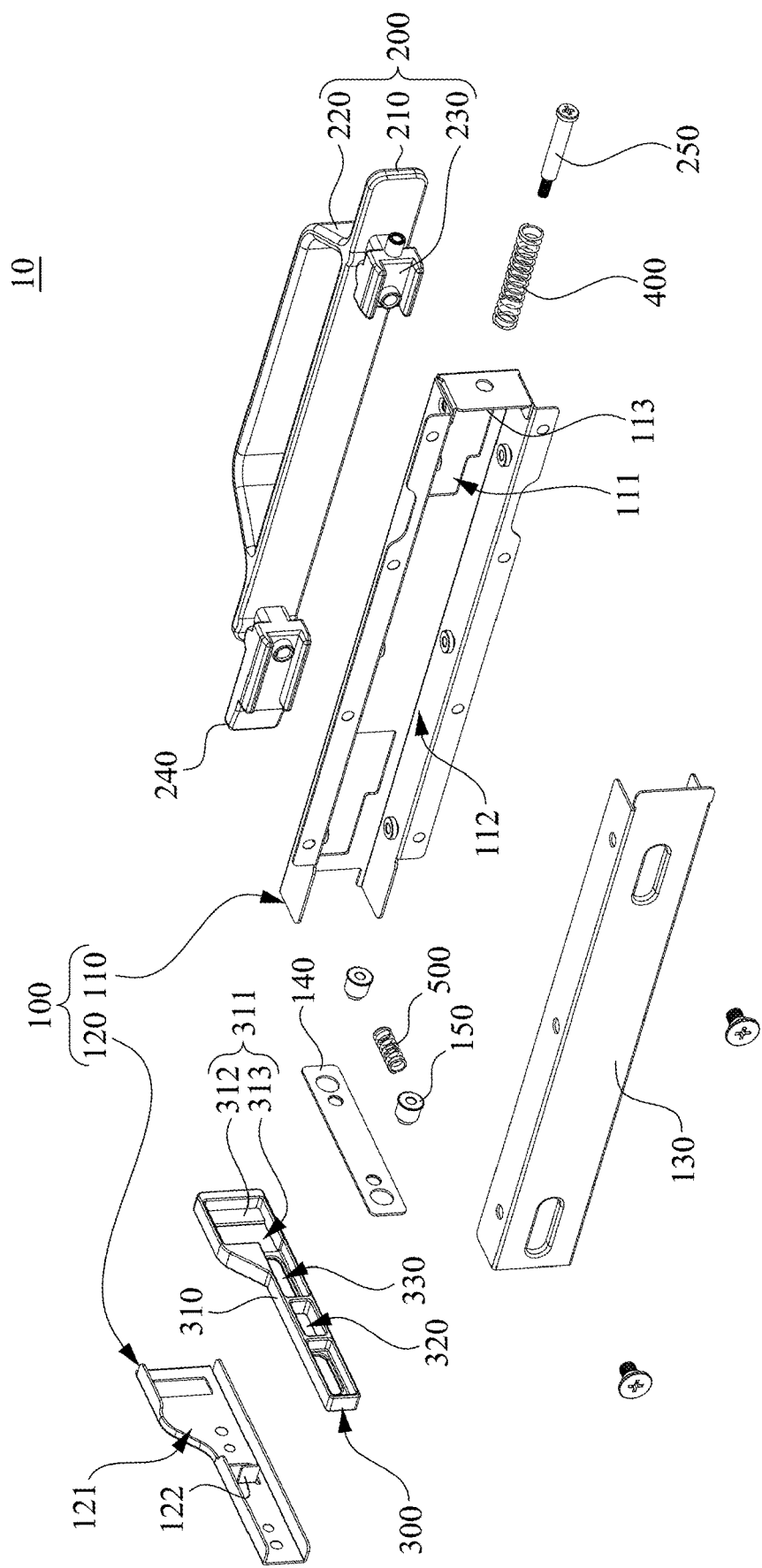
FIG. 2 is an exploded view of the latch mechanism of FIG. 1.
Figure 3A:
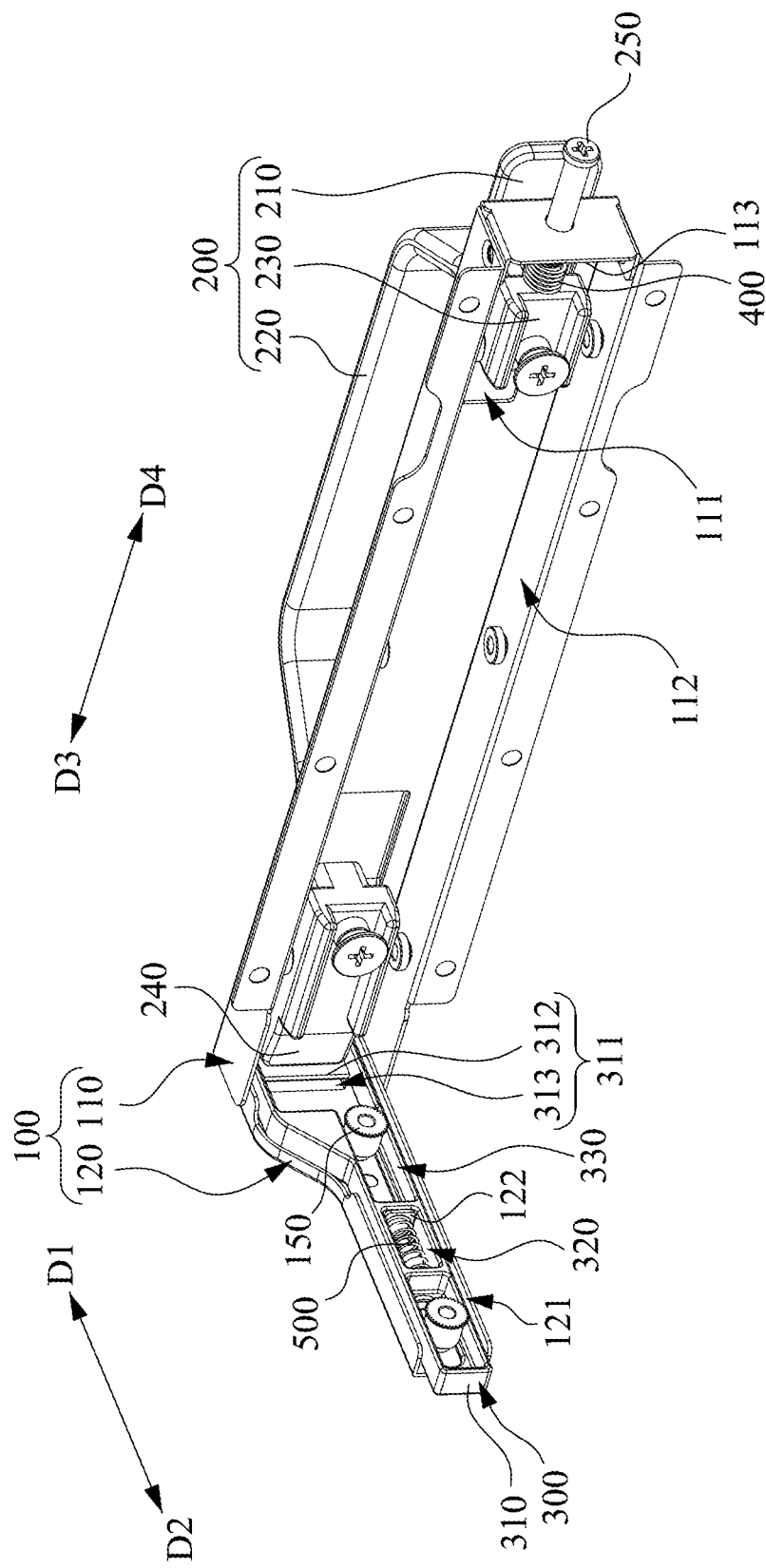
FIG. 3A and FIG. 3B are operational schematic views of the latch mechanism of FIG. 1.
Figure 3B:
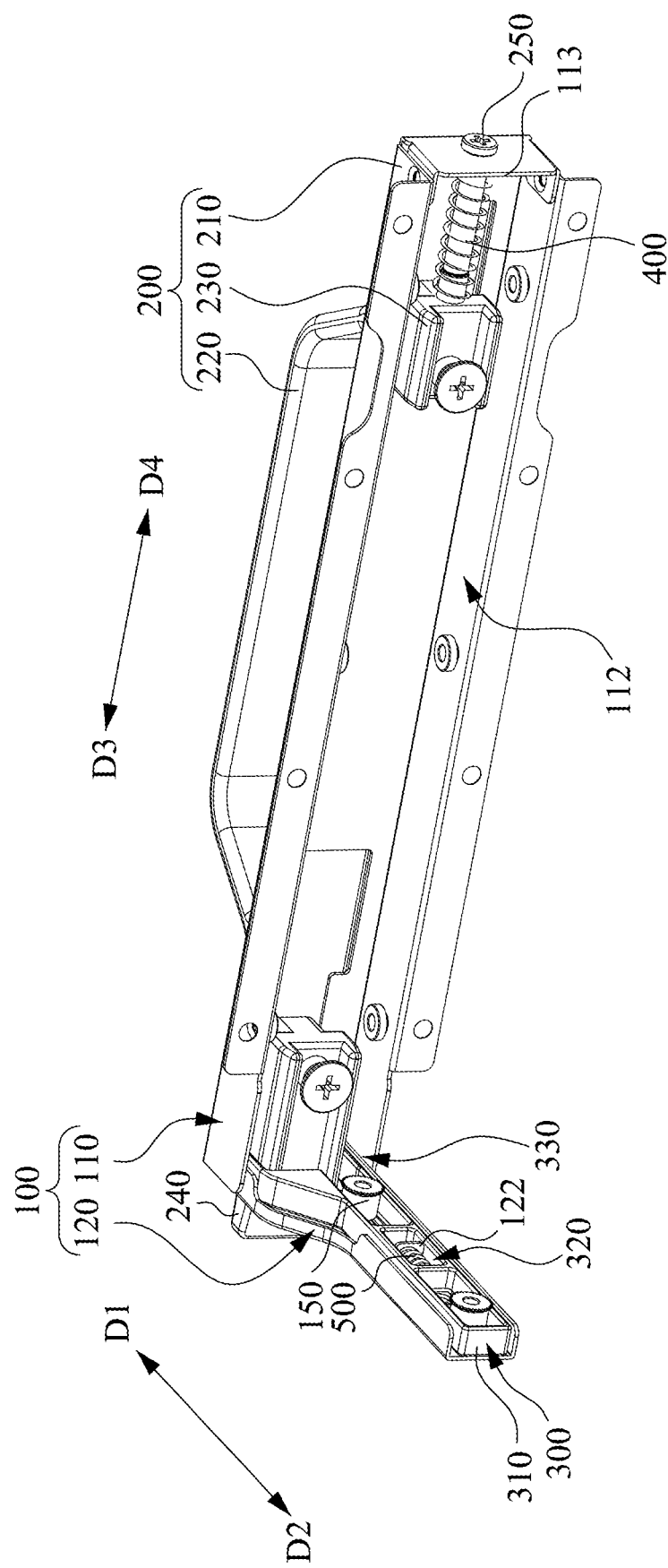

Reference is now made to FIG. 1 to FIG. 3B, in which FIG. 1 is a perspective view of a latch mechanism 10 according to one embodiment of the present disclosure, FIG. 2 is an exploded view of the latch mechanism 10 of FIG. 1, and FIG. 3A and FIG. 3B are operational schematic views of the latch mechanism 10 of FIG. 1. As shown in FIG. 1 to FIG. 3A, the latch mechanism 10 includes a bracket 100, a sliding element 200, a latch portion 240, a first elastic element 400 and a trigger element 300. The sliding element 200 is slidably located on the bracket 100. The latch portion 240 is fixedly connected to the sliding element 200. The first elastic element 400 is connected to the bracket 100 and the sliding element 200. The trigger element 300 includes an elongated frame 310, a pressed portion 312 and a through hole 313. The elongated frame 310 is slidably located on the bracket 100. Both of the pressed portion 312 and the through hole 313 are respectively formed on one surface of the elongated frame 310, and the pressed portion 312 is connected to the through hole 313, and directly pressed by the latch portion 240.

More specifically, in the embodiment, the bracket 100 includes a front frame 110, a side frame 120, a first cover plate 130 and a second cover plate 140. The side frame 120 is adjacent to the front frame 110, and a long axis direction L1 of the front frame 110 and a long axis direction L2 of the side frame 120 are intersected, or even orthogonal to each other. The front frame 110 is provided with a groove 112 and a breach 111 respectively at two opposite sides thereof, and the groove 112 is in communication with the breach 111.

The sliding element 200 further includes a plate body 210, a handle portion 220 and at least one sliding block 230. The plate body 210 is slidably disposed on one side of the front frame 110 facing away from the groove 112, and a long axis direction L1 of the plate body 210 and a long axis direction L2 of the elongated frame 310 are intersected, or even orthogonal to each other. The handle portion 220 is fixed on one side of the plate body 210. The sliding block 230 is disposed on the other side of the plate body 210, and the sliding block 230 extends into the groove 112 through the breach 111 so as to be slidably received within the groove 112. The latch portion 240, for example is wedge-shaped, and is integrally formed at one end of the plate body 210. The first elastic element, for example is a compression spring, and is located within the groove 112 to abut against an inner wall 113 of the front frame 110 and the sliding block 230. Thus, when the sliding block 230 and the inner wall 113 of the front frame 110 respectively compress the first elastic element 400, a first resilient force stored by the first elastic element 400 can continue to make the latch portion 240 to directly press the pressed portion 312 of the trigger element 300. The first cover plate 130 is secured on the front frame 110 to cover the groove 112 so that the sliding block 230 and the first elastic element 400 are able to be stably limited within the groove 112.

Also, the sliding element 200 further includes a load pin 250. The load pin 250 is disposed on the sliding block 230 to go through the inner wall 113 of the front frame 110 (FIG. 3A) and the first elastic element 400. Thus, the load pin 250 is extendable on the front frame 110 along with the sliding block 230 for compressing the first elastic element 400.

Furthermore, one surface of the side frame 120 is formed with a ditch 121. The elongated frame 310 is slidably received within the ditch 121. More specifically, the elongated frame 310 further includes a recessed portion 311, a receiving trench 320 and two guiding trenches 330. The recessed portion 311, the receiving trench 320 and the guiding trenches 330 are commonly formed on one surface of the elongated frame 310 facing away from the side frame 120, and one of the guiding trenches 330 is arranged between the recessed portion 311 and the receiving trench 320. The pressed portion 312 and the through hole 313 are commonly formed on a bottom of the recessed portion 311, and the pressed portion 312 and the through hole 313 are in communication with each other. The bracket 100 is further formed with two studs 150. One end of each of the studs is fixed on the side frame 120, and the other end thereof is slidably disposed within the corresponding one of the guiding trenches 330. Thus, with the guidance of the studs 150 in the guiding trenches 330, the elongated frame 310 is able to be slidable back and forth within the ditch 121.

In the embodiment, the latch mechanism 10 further includes a second elastic element 500. The second elastic element 500 is connected to the side frame 120 and the elongated frame 310. The second elastic element 500 is, for example, a compression spring, and is located within the receiving trench 320 to abut against a lug 122 of the elongated frame 310 and the side frame 120. When the sliding block 230 and the inner wall 113 of the front frame 110 respectively compress the second elastic element 500, a second resilient force stored by the second elastic element 500 being compressed can move the elongated frame 310 back to the original position. The second cover plate 140 is fixed on the side frame 120 to cover the ditch 121 such that the trigger element 300 and the second elastic element 500 are stably limited within the ditch 121.

In order to clearly show the continuous operating relationship of the latch mechanism 10, FIGS. 3A and 3B respectively omit the first cover plate 130 and the second cover plate 140 of the bracket 100 to see through the bracket 100.

Thus, as shown in FIG. 3A, when one end of the trigger element 300 is pushed in a first direction D1 such that the through hole 313 is moved in the first direction D1 to align with the latch portion 240 (FIG. 3B), the first resilient force of the first elastic element 400 accordingly pushes the latch portion 240 to extend into the through hole 313 in the third direction D3 (FIG. 3B). When the trigger element 300 is pushed, the second elastic element 500 is compressed by the elongated frame 310 and the lug 122 of the elongated frame 310 so as to store the aforementioned second resilient force (FIG. 3B).

Conversely, as shown in FIG. 3B, when the sliding element 200 is moved in a fourth direction D4 through the handle portion 220 so as to draw the latch portion 240 back away from the through hole in the fourth direction D4 (FIG. 3A), the second resilient force of the second elastic element 500 immediately pushes the trigger element 300 in the second direction D2, so that the latch portion 240 is instantly moved to the pressing portion 312 from the through hole 313 after the latch portion 240 being drawn back from the through hole 313. Thus, the pressing portion 312 stops the movement of the latch portion 240 along the third direction D3 (FIG. 3A). When the latch portion 240 is drawn back from the through hole 313, the first elastic element 400 is compressed by the sliding block 230 and the inner wall 113 of the front frame 110 so as to store the aforementioned first resilient force (FIG. 3A).

Figure 4:
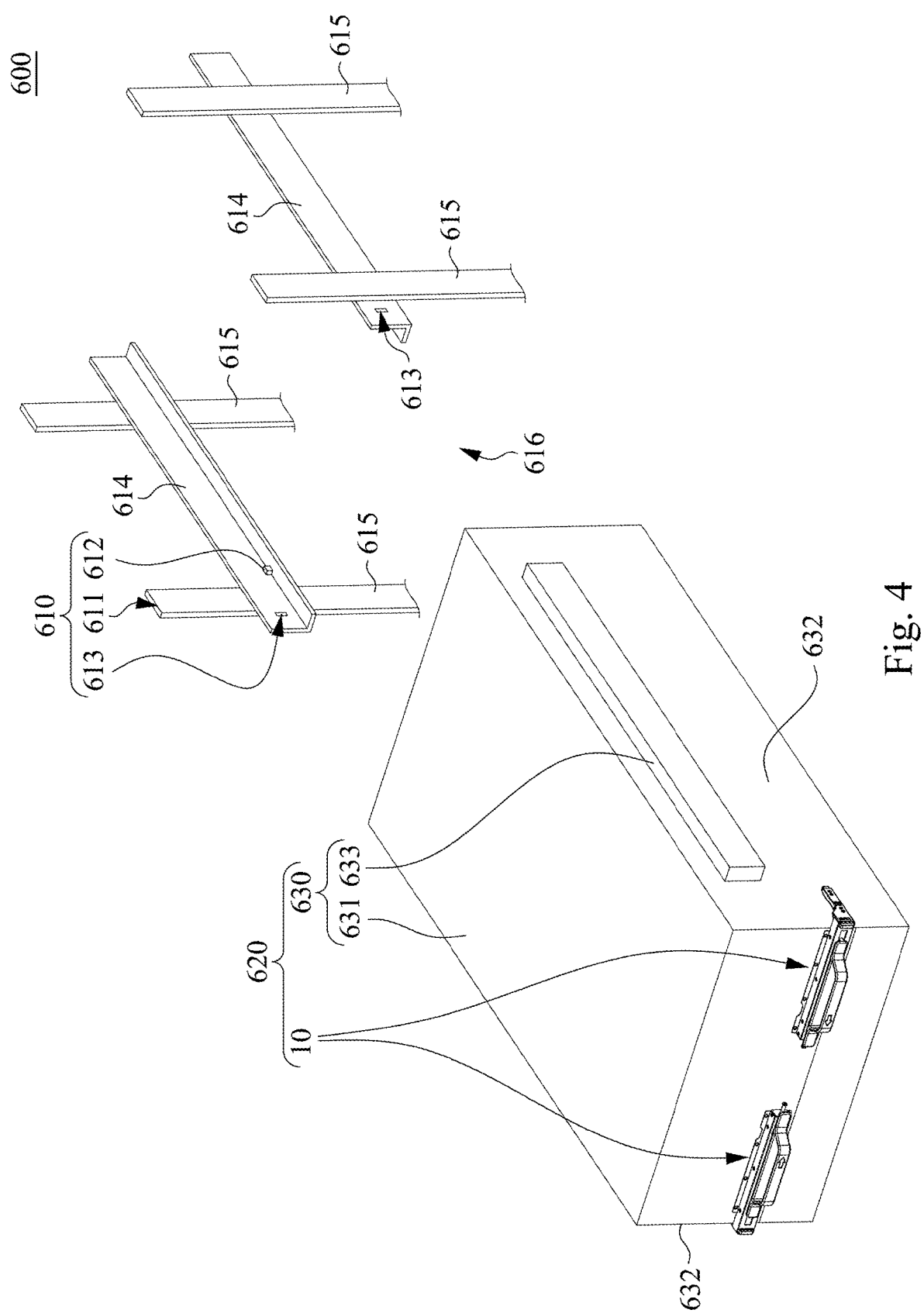
FIG. 4 is an exploded view of a server equipment according to one embodiment of the present disclosure.

FIG. 4 is an exploded view of a server equipment 600 according to one embodiment of the present disclosure. As shown in FIG. 2 and FIG. 4, the server equipment 600 includes a chassis 610, two guide rails 614 and at least one unit rack 620. The chassis 610 is provided with a frame body 611, two stopping blocks 612 and two fixing recesses 613. Each of the guide rails 614 is fixedly connected to an inner surface of the frame body 611. The stopping blocks 612 and the fixing recesses 613 are respectively disposed on the frame body 611.

In the embodiment, for example, the frame body 611 includes four external pillar members 615. The external pillar members 615 are arranged upright and spaced apart to collectively surround an inner space 616. Each of the guide rails 614 is fixedly connected to two of the external pillar members 615. Thus, the unit rack 620 is allowed to slide into the inner space 616 of the frame body 611 along the guide rails 614. The stopping blocks 612 and the fixing recesses 613 are respectively located on the guide rails 614. For example, each of the fixing recesses 613 is located at a position of one of the guide rails 614 being closer to an entrance of the inner space 616, and each of the stopping blocks 612 is located at another position of one of the guide rails 614 being further away from the entrance of the inner space 616.

each of the unit racks 620 includes a tray device 630 and two latch mechanisms 10. The tray device 630 includes a case 631 removably disposed within the frame body 611. The sliding rails are fixedly mounted on two outer sides 632 of the case 631 and slidably located at the corresponding guide rails 614.

As shown in FIG. 2 and FIG. 4, the latch mechanism 10 includes a bracket 100, a sliding element 200, a latch portion 240, a first elastic element 400 and a trigger element 300. The bracket 100 is disposed on the outer side 632 of the case 631. In the embodiment, the front frame 110 of the bracket 100 is disposed at a front end of the case 631, and the side frame 120 of the bracket 100 is disposed at the outer side 632 of the case 631, and disposed below the corresponding sliding rail 633. The sliding element 200 is slidably located on the bracket 100. The latch portion 240 is fixedly connected to the sliding element 200. The first elastic element 400 is connected to the bracket 100 and the sliding element 200. The trigger element 300 includes an elongated frame 310, a pressed portion 312 and a through hole 313. The elongated frame 310 is slidably located on the bracket 100. The through hole 313 is formed on one surface of the elongated frame 310, and the pressed portion 312 is formed on the surface of the elongated frame 310, and the pressed portion 312 is directly pressed by the latch portion 240.

Thus, when the case 631 is moved into the frame body 611, and slid to a specific position along the guide rails 614 through the sliding rails 633, since the stopping blocks 612 in the frame body 611 pushes the corresponding trigger element 300 respectively, so that the through hole 313 of each of the latch mechanism 10 is exactly moved to the latch portion 240 to align with the fixing recesses 613, the first elastic element 400 moves the latch portion 240 to extend into the fixing recess 613 through the through hole 313, thereby the tray device 630 can fixedly held on the chassis 610.

It is noted, in addition to the stopping blocks 612 used to trigger the latch mechanism 10, the stopping blocks 612 further can also be used as a stop element for preventing the unit rack 620 from continuing to move.

Thus, through the construction of the embodiments above, the present disclosure not only will prevent from occupying the configuration space of the unit rack, but also reducing the complexity of the installation process of the unit rack.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims and their equivalents.

What is claimed is:

1. A latch mechanism, comprising:
   a bracket comprising a front frame and a side frame that is directly adjacent to the front frame, the side frame comprising a ditch and an opening connected to the ditch, wherein a long axis direction of the front frame and a long axis direction of the side frame are intersected;
   a sliding element slidably located on the front frame of the bracket;
   a latch portion fixedly connected to the sliding element;
   a first elastic element connected to the front frame of the bracket and the sliding element; and
   a trigger element comprising:
      an elongated frame slidably received within the ditch of the side frame;
      a through hole formed on one surface of the elongated frame, and connected to the opening; and
      a pressed portion disposed on the one surface of the elongated frame, and directly pressed by the latch portion, wherein one end of the elongated frame being away from the pressed portion extends outwards from the ditch along the long axis direction of the side frame,
      wherein when the end of the elongated frame of the trigger element is pushed such that the through hole is moved to the latch portion, the first elastic element moves the latch portion to extend into the through hole and the opening.

2. The latch mechanism of claim 1, wherein the front frame is provided with a groove and a breach respectively at two opposite sides thereof, and the groove is in communication with the breach; and
   the sliding element further comprises a handle portion slidably disposed on one surface of the front frame opposite to the groove, and a sliding block extending into the groove through the breach and slidably received within the groove, wherein the first elastic element is located within the groove to abut against an inner wall of the front frame and the sliding block.

3. The latch mechanism of claim 2, wherein the sliding element further comprises:
   a load pin disposed on the sliding block to go through the inner wall of the front frame and the first elastic element,
   wherein when the latch portion is drawn back from the through hole, the first elastic element is compressed by the inner wall of the front frame and the sliding block.

4. The latch mechanism of claim 1, wherein
   the long axis direction of the front frame and the long axis direction of the side frame are orthogonal to each other.

5. The latch mechanism of claim 4, further comprising:
   a second elastic element connected to the side frame and the elongated frame,
   wherein when the latch portion is drawn back from the through hole, the second elastic element pushes the trigger element such that the latch portion is moved to the pressed portion from the through hole to directly press against the pressed portion.

6. A server equipment, comprising:
   a chassis provided with a frame body, a stopping block and a fixing recess, wherein the stopping block and the fixing recess are respectively disposed on the frame body;
   at least one guide rail fixedly connected to an inner surface of the frame body; and
   a unit rack, comprising:
      a tray device comprising a case removably disposed within the frame body, and at least one sliding rail fixedly mounted on an outer side of the case and slidably located at the at least one guide rail; and
      a latch mechanism comprising a bracket disposed on the outer side of the case, a sliding element slidably located on the bracket, a latch portion fixedly connected to the sliding element, a first elastic element connected to the bracket and the sliding element, and a trigger element comprising an elongated frame, a through hole and a pressed portion, wherein the elongated frame is slidably located on the bracket, the through hole is formed on one surface of the elongated frame, and the pressed portion is disposed on the one surface of the elongated frame, and directly pressed by the latch portion,
   wherein when the case is slid along the guide rail until the stopping block pushes the trigger element such that the through hole is moved to the latch portion to align with the fixing recess, the first elastic element moves the latch portion to extend into the fixing recess through the through hole, thereby the tray device being fixedly held on the chassis.

7. The server equipment of claim 6, wherein the bracket comprises a front frame, the front frame is provided with a groove and a breach respectively at two opposite sides thereof, and the groove is in communication with the breach; and
   the sliding element further comprises a handle portion slidably disposed on one surface of the front frame opposite to the groove, and a sliding block extending into the groove through the breach and slidably received within the groove, wherein the first elastic element is located within the groove to abut against an inner wall of the front frame and the sliding block.

8. The server equipment of claim 7, wherein the sliding element further comprises:
   a load pin disposed on the sliding block to go through the inner wall of the front frame and the first elastic element,
   wherein when the latch portion is drawn back from the through hole, the first elastic element is compressed by the inner wall of the front frame and the sliding block.

9. The server equipment of claim 7, wherein the bracket further comprises a side frame being adjacent to the front frame and disposed below the sliding rail, such that the elongated frame is slidably located on the side frame,
   wherein a long axis direction of the front frame and a long axis direction of the side frame are orthogonal to each other.

10. The server equipment of claim 9, further comprising:
    a second elastic element connected to the side frame and the elongated frame,
    wherein when the latch portion is drawn back from the through hole, the second elastic element pushes the trigger element such that the latch portion is moved to the pressed portion from the through hole to directly press against the pressed portion.

* * * * *